United States Patent [19]

Sugimoto

[11] Patent Number: 4,499,429
[45] Date of Patent: Feb. 12, 1985

[54] VARIABLE GAIN CONTROL CIRCUIT

[75] Inventor: Yasuhiro Sugimoto, Yokohama, Japan

[73] Assignee: Tokyo Shibaura Denki Kabushiki Kaisha, Japan

[21] Appl. No.: 465,022

[22] Filed: Feb. 8, 1983

[30] Foreign Application Priority Data

Feb. 26, 1982 [JP] Japan .................................. 57-28735

[51] Int. Cl.³ .......................... H03F 3/45; H03G 3/10
[52] U.S. Cl. ..................................... 330/254; 330/285
[58] Field of Search ............... 330/254, 279, 283, 285, 330/278

[56] References Cited

U.S. PATENT DOCUMENTS 3,512,096  5/1970  Nagata et al. ........................ 330/252
3,581,222  5/1971  Dunwoodie ......................... 330/201
4,340,866  7/1982  Metz .................................... 330/254

OTHER PUBLICATIONS

Blauschild, "An Open Loop Programmable Amplifier with Extended Frequency Range," IEEE Journal of Solid-State Circuits, vol. SC-16, No. 6, pp. 626-633, Dec. 1981.
Blauschild, "An Open-Loop Programmable Amplifier with a Maximum Gate-Bandwidth Product of 1GHz," IEEE International Solid-State Circuits Conference, vol. 24, pp. 190, 191, 272, 2/81.

Primary Examiner—James B. Mullins
Assistant Examiner—G. Wan
Attorney, Agent, or Firm—Finnegan, Henderson, Farabow, Garrett & Dunner

[57] ABSTRACT

A variable gain control circuit comprises first, second, third and fourth transistors each having an emitter, a base and a collector. The bases of the first and second transistors are connected to receive a control signal. The collector of the first transistor is connected to a first reference power source through a resistor. An output is generated from the node of the collector of the first transistor and the resistor. The collector of the second transistor is connected to the first reference power source, too. The emitter of the first transistor is connected to the base of the third transistor and the collector of the fourth transistor. The emitter of the second transistor is connected to the collector of the third transistor, and the base of the fourth transistor. It further comprises a first PN junction forwardly connected in series to the base-emitter junction of the third transistor, a second PN junction forwardly connected in series to the base-emitter junction of the fourth transistor, and an input signal supplying means connected between the first and second PN junctions on one hand and a second reference power source on the other hand.

10 Claims, 5 Drawing Figures

F I G. 3
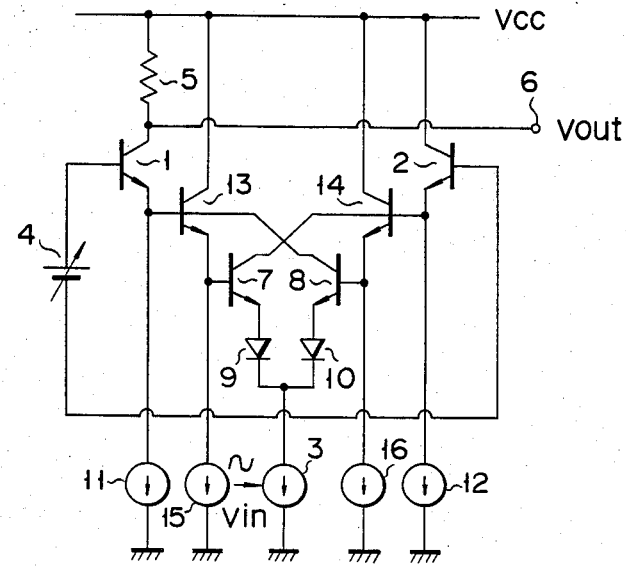
F I G. 4
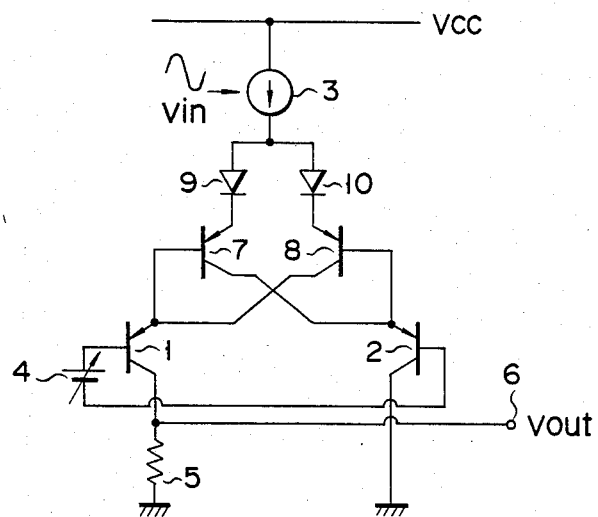

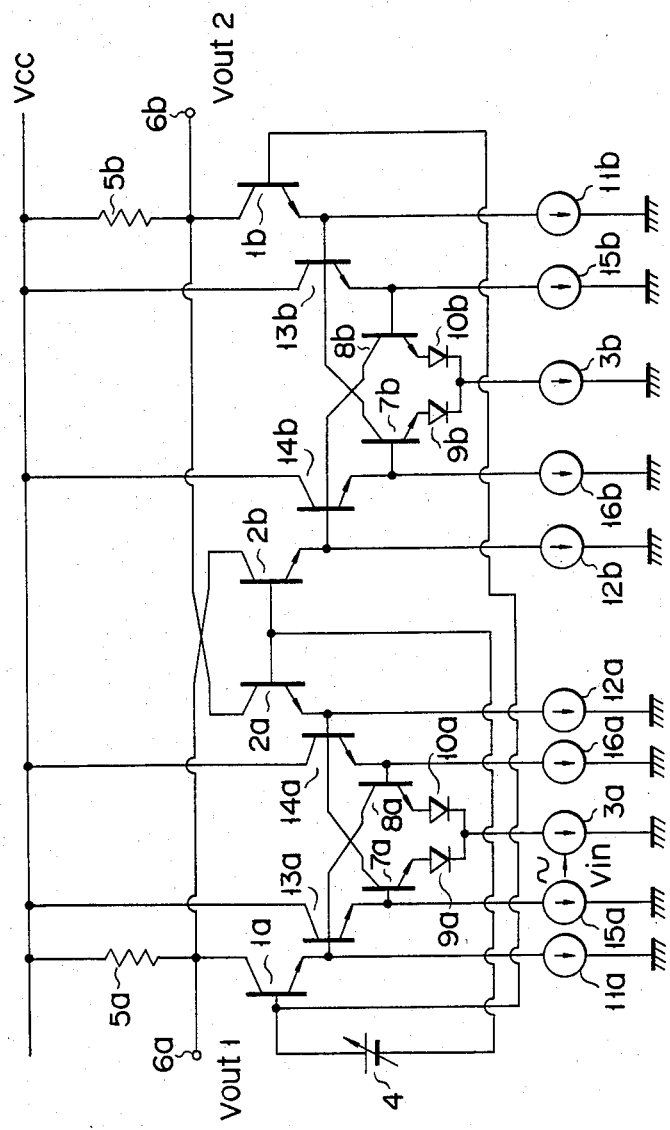
F I G. 5

VARIABLE GAIN CONTROL CIRCUIT

BACKGROUND OF THE INVENTION

The present invention relates to a variable gain control circuit.

A variety of variable gain control circuits are known which are designed to vary the gain by the control signal. S. Tanaka et al. "Non-linearity Improvement of Variable Gain Circuit For T.V. Camera Use", Institute of Television Engineers (ITE) Conference, Nov. 29, 1978, TBS50-1, for example, discloses a circuit in which the control voltages applied to the bases of a pair of transistors are varied, thus changing the collector current of either transistor and thus varying the gain of the circuit. The ratio of the collector current of one of the transistors to the collector current of the other transistor non-linearly changes because each transistor has a base resistance. Both the differential gain characteristic and differential phase characteristic of this variable gain control circuit are inevitably not so good.

The thesis identified above further discloses the technique of connecting a positive feedback loop with a feedback factor $G \cdot \beta = \frac{1}{2}$ to the bases of a pair of transistors to eliminate the influence of the base resistance of either transistor. The thesis, however, does not teach how to apply the technique to a variable gain control circuit.

The known variable gain control circuits have another drawback. In each of them, when rectangular wave control signals are supplied to a pair of transistors, thus controlling the switching operation of the transistors, the switching speed of one transistor which is cut off is inevitably lower than that of the other transistor which is not cut off. Consequently, the circuit generates an output signal containing a glitch.

SUMMARY OF THE INVENTION

It is an object of the present invention to provide a variable gain control circuit which has a positive feedback loop having a feedback factor of $\frac{1}{2}$ and which has good linearity.

Another object of the invention is to provide a variable gain control circuit which generates an output signal containing no glitch even when rectangular wave signals are supplied to it as control signals.

In order to achieve the objects described above, a control signal is supplied to the bases of a differential pair of transistors, and the emitters of both transistors are connected to an input signal supplying means through the emitter-base junctions of two transistors which have common base connections and through two diodes which are forwardly connected to the base-emitter junctions of these two transistors, respectively. An output signal is generated from the collector of one of the transistors which form the differential pair.

In a variable gain control circuit according to the invention, the base-emitter junctions of transistors and diodes are used to provide a positive feedback loop having a feedback factor of $\frac{1}{2}$. The electrical characteristics of the base-emitter junctions of the transistors and that of the diodes can be matched with each other even when the circuit is fabricated in the form of an integrated circuit. The variable gain control circuit according to the invention can therefore be manufactured to have high precision.

BRIEF DESCRIPTION OF THE DRAWINGS

Other objects and advantages of the invention will be apparent from the following description taken in conjunction with the accompanying drawings in which:

FIG. 3 is a circuit diagram of a third embodiment of the invention;

FIG. 4 is a circuit diagram of a fourth embodiment of the invention; and

FIG. 5 is a circuit diagram of a fifth embodiment of the invention.

DETAILED DESCRIPTION OF THE PREFERRED EMBODIMENTS

Figure 1:
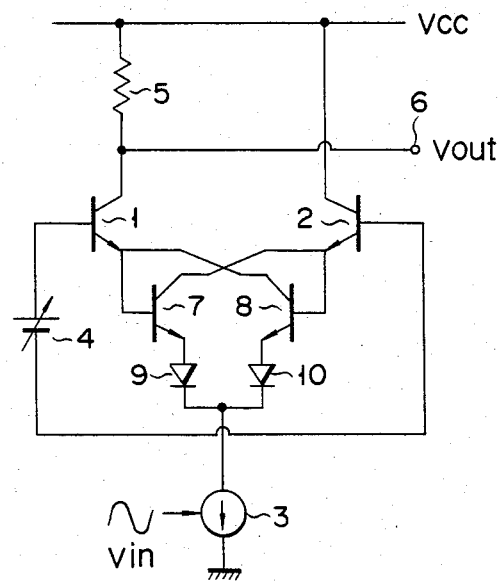
FIG. 1 is a circuit diagram of a first embodiment of the present invention.

A first embodiment of the invention will be described with reference to FIG. 1. As shown in FIG. 1, a control signal source 4 is connected between the base of a first transistor 1 of NPN type and the base of a second transistor 2 of NPN type. The collector of the first transistor 1 is connected to a power source Vcc through a resistor 5. It is connected also to a terminal 6 for supplying an output signal Vout. The collector of the second transistor 2 is connected to the power source Vcc. A third transistor 7 and a fourth transistor 8, both NPN type, are provided. The base and collector of the third transistor 7 are connected to the emitters of the transistors 1 and 2, respectively. The base and collector of the fourth transistors 8 are connected to the emitters of the transistors 2 and 1, respectively. The emitter of the third transistor 7 is connected to an input signal supplying means 3 through a diode 9. The diode 9 is forwardly connected to the emitter of the transistor 7. Similarly, the emitter of the fourth transistor 8 is connected to the input signal supplying means 3 through a diode 10. The diode 10 is forwardly connected to the emitter of the transistor 8. The input signal supplying means 3 is a current source for supplying current containing a DC component and an AC component which is varied by an input signal Vin.

The operation of the circuit shown in FIG. 1 will be described. The control voltage of the control signal source 4 is changed, thus raising the base potential of the first transistor 1 higher than that of the second transistor 2. The base potential of the third transistor 7 is then raised, and the collector current of the third transistor 7 increases. As a result, more current flows from the input signal supplying means 3 through a circuit consisting of the transistors 2 and 7 and the diode 9 than through a circuit consisting of the transistors 1 and 8 and the diode 10. As the current flowing through the second transistor 2 increases, a great voltage drop is caused by the AC emitter resistance re2. This voltage drop reduces the base potential of the fourth transistor 8. As the current flowing through the second transistor 2 further increases, the base potential of the fourth transistor 8 further falls and the ratio of signal current flowing through the transistor 7 to signal current flowing through the transistor 8 increases. A positive feedback loop is thus formed.

The AC emitter resistance re2 of the transistor 2, the AC emitter resistance re7 of the transistor 7 and the AC resistance re9 of the diode 9 have the following relation:

$$re2 \simeq re7 \simeq re9 \tag{1}$$

Therefore, the positive feedback loop has a feedback factor G·β which is given as follows:

$$G \cdot \beta = \frac{re2}{re7 + re9} \simeq \frac{1}{2} \quad (2)$$

In the circuit of FIG. 1, the control signal source 4 is a DC source connected between the bases of the transistors 1 and 2. The control signal source 4 is used to provide a potential difference between the bases of the transistors 1 and 2. Therefore, the base potential of one of these transistors may be fixed and the base potential of the other may be varied.

Figure 2:
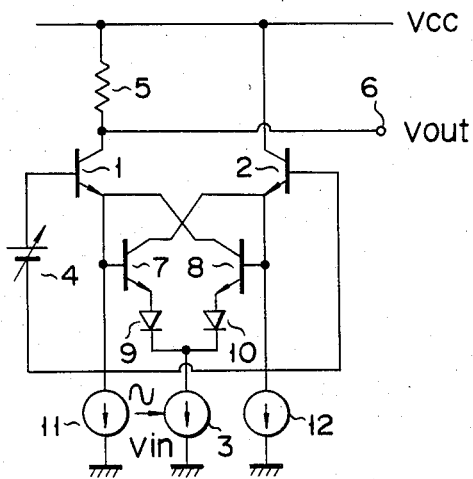
FIG. 2 is a circuit diagram of a second embodiment of the invention.

A second embodiment of the invention will now be described with reference to FIG. 2. As shown in FIG. 2, a constant current source 11 is connected to the emitter of a first transistor 1 and another constant current source 12 is connected to the emitter of a second transistor 2. Except for this, the circuit of FIG. 2 is identical with the first embodiment shown in FIG. 1. The circuit is advantageous in the following respect.

Even if the control signal from a control signal source 4 has a high frequency rectangular waveform, neither the transistor 1 nor the transistor 2 is cut off. This is because the constant current sources 11 and 12 are connected to the emitters of the transistors 1 and 2, respectively. Hence, an output signal of the circuit contains no glitch. The gain of the circuit can therefore effectively be controlled at high speed. Indeed the transistors 7 and 8 and diodes 9 and 10 of the circuit may be almost cut off, but this circuit can be switched at high speed because a positive feedback loop as provided in the first embodiment is formed in this circuit, too.

A third embodiment of the present invention will now be described with reference to FIG. 3. This embodiment differs from the second embodiment of FIG. 2 in the following respects. First, the base-emitter junction of an NPN transistor 13 is connected between the emitter of a transistor 1 and the base of a transistor 7. Second, the base-emitter of an NPN transistor 14 is connected between the emitter of a transistor 2 and the base of a transistor 8. Third, a constant current source 15 is connected to the emitter of the transistor 13, and a constant current source 16 to the emitter of the transistor 14. Fourth, the collectors of the transistors 13 and 14 are connected to a power source Vcc. The third embodiment having this structure, the dynamic range of a control signal source 4 is broadened to about 1 V.

A fourth embodiment of the invention will be described with reference to FIG. 4. This embodiment is identical with the first embodiment shown in FIG. 1, except for the following points. First transistors 1, 2, 7 and 8 used are of PNP type. Second, the polarity of a power source Vcc is inverted. Third, a diode is forwardly connected to the base-emitter junction of the transistor 7 and a diode 10 is forwardly connected to the base-emitter junction of the transistor 8. The fourth embodiment functions in the same manner as the first embodiment shown in FIG. 1.

A fifth embodiment of the invention will be described with reference to FIG. 5. This variable gain control circuit is a double balance type in which the DC component of an output voltage is kept constant. It has an input signal supplying means 3a and a constant current source 3b. The constant current source 3b is actuated by the average input voltage applied to the input signal supplying means 3a. With the structure shown in FIG. 5, the voltage of an output signal Vout1 falls and the voltage of another output signal Vout2 rises when the base potentials of transistors 1a and 1b are raised. Conversely, the voltage of the output signal Vout1 rises when the base potentials of transistors 2a and 2b are raised. When a control signal from a control signal source 4 reduces the DC current flowing through the transistor 1a, the DC current flowing through the transistor 2b will increase. Hence, the DC component of the output signal Vout1 will become constant. The same is true of the DC component of the output signal Vout2.

As described above, a positive feedback loop having a feedback factor of ½ is used in the present invention. The invention can therefore provide a variable gain control circuit with a good linearity, which generates an output signal containing no glitch even when it is controlled by a high-speed switching control signal. Since the positive feedback loop is comprised of PN junctions, the circuit of the invention has high precision.

Obviously, many modifications and variations of the present invention are possible in the light of the above teachings. It is therefore to be understood that within the scope of the appended claims, the invention may be practiced other than as specifically described.

What is claimed is:

1. A variable gain control circuit comprising:

a first transistor having an emitter, a base and a collector connected to a first reference power source through resistor means for generating an output signal from the node of said collector and said resistor means;

a second transistor having an emitter, a base and a collector connected to said first reference power source;

control means, provided between the base of said first transistor and the base of said second transistor, for controlling base voltages of said first and second transistors;

a third transistor and a fourth transistor, each having an emitter, a base and a collector;

means for connecting the emitter of said first transistor to the base of said third transistor;

means for connecting the emitter of said second transistor to the collector of said third transistor;

means for connecting the emitter of said first transistor to the collector of said fourth transistor;

means for connecting the emitter of said second transistor to the base of said fourth transistor;

a first PN junction forwardly connected in series to the base-emitter junction of said third transistor;

a second PN junction forwardly connected in series to the base-emitter junction of said fourth transistor; and input signal supplying means connected between a second reference power source and said first and second PN junctions for receiving an input signal and supplying current containing a DC component and an AC component which is varied by said input signal.

2. A variable gain control circuit according to claim 1, further comprising a first constant current source connected between the emitter of said first transistor and said second reference power source, and a second constant current source connected between the emitter of said second transistor and said second reference power source.

3. A variable gain control circuit according to claim 1, further comprising a third PN junction provided between the emitter of said first transistor and the base of said third transistor and forwardly connected to the base-emitter junction of said first transistor and a fourth PN junction provided between the emitter of said second transistor and the base of said fourth transistor and forwardly connected to the base-emitter junction of said second transistor.

4. A variable gain control circuit according to claim 3, wherein said third PN junction is the base-emitter junction of a fifth transistor and said fourth PN junction is the base-emitter junction of a sixth transistor, the emitters of said fifth and sixth transistors being each connected to a constant current source, and the collectors of said fifth and sixth transistors being connected to said first reference power source.

5. A variable gain control circuit according to claim 4, further comprising a first constant current source connected between the emitter of said first transistor and said second reference power source, a second constant current source connected between the emitter of said second transistor and said second reference power source, a third constant current source connected between the emitter of fifth transistor and said second reference power source, and a fourth constant current source connected between the emitter of sixth transistor and said second reference power source.

6. A variable gain control circuit comprising:
a first transistor having an emitter, a base and a collector connected to a first reference power source through first resistor means for generating a first output signal from the node of said collector and said first resistor means;
a second transistor having an emitter, a base and a collector connected to the first reference power source through a second resistor means for generating a second output signal from the node of said collector and said second resistor means;
control means, provided between the base of said first transistor and the base of said second transistor, for controlling base voltages of said first and second transistors;
a third transistor and a fourth transistor, each having an emitter, a base and a collector;
means for connecting the emitter of said first transistor to the base of said third transistor;
means for connecting the emitter of said second transistor to the collector of said third transistor;
means for connecting the emitter of said first transistor to the collector of said fourth transistor;
means for connecting the emitter of said second transistor to the base of said fourth transistor;
a first PN junction forwardly connected in series to the base-emitter junction of said third transistor;
a second PN junction forwardly connected in series to the base-emitter junction of said fourth transistor;
input signal supplying means, connected between a second reference power source and said first and second PN junctions, for receiving an input signal and supplying current containing a DC component and an AC component which is varied by said input signal;
a fifth transistor having an emitter, a base connected to the base of said second transistor and a collector connected to the collector of said first transistor;
a sixth transistor having an emitter, a base connected to the base of said first transistor and a collector connected to the collector of said second transistor;
a seventh transistor and an eighth transistor, each having an emitter, a base and a collector;
means for connecting the emitter of said fifth transistor to the base of said seventh transistor;
means for connecting the emitter of said sixth transistor to the collector of said seventh transistor;
means for connecting the emitter of said fifth transistor and the collector of said eighth transistor;
means for connecting the emitter of said sixth transistor to the base of said eighth transistor;
a third PN junction forwardly connected in series to the base-emitter junction of said seventh transistor;
a fourth PN junction forwardly connected in series to the base-emitter junction of said eighth transistor; and
a constant current source connected between said second reference power source and said third and fourth PN junctions.

7. A variable gain control circuit according to claim 6, further comprising four constant current sources connected to the emitters of said first, second, fifth and sixth transistors, respectively.

8. A variable gain control circuit according to claim 6, further comprising:
a fifth PN junction provided between the emitter of said first transistor and the base of said third transistor and forwardly connected to the base-emitter junction of said first transistor;
a sixth PN junction provided between the emitter of said second transistor and the base of said fourth transistor and forwardly connected to the base-emitter junction of said second transistor;
a seventh PN junction provided between the emitter of said fifth transistor and the base of said seventh transistor and forwardly connected to the base-emitter junction of said fifth transistor; and
an eighth PN junction provided between the emitter of said sixth transistor and the base of said eighth transistor and forwardly connected to the base-emitter junction of said sixth transistor.

9. A variable gain control circuit according to claim 8, wherein said fifth and sixth PN junctions are the base-emitter junction of a ninth transistor and the base-emitter junction of a tenth transistor, respectively, the emitters of said ninth and tenth transistors being each connected to a constant current source, and the collectors of said ninth and tenth transistors being connected to said first reference power source, and said seventh and eighth PN junctions are the base-emitter junction of a eleventh transistor and the base-emitter junction of a twelfth transistor, respectively, the emitters of said eleventh and twelfth transistors being each connected to a constant current source, and the collectors of said eleventh and twelfth transistors being connected to said first reference power source.

10. A variable gain control circuit according to claim 9, further comprising eight constant current sources connected to the emitters of said first, second, fifth, sixth, ninth, tenth, eleventh and twelfth transistors, respectively.

* * * * *